(12) United States Patent
Shiozawa

(10) Patent No.: US 7,371,607 B2
(45) Date of Patent: May 13, 2008

(54) METHOD OF MANUFACTURING SEMICONDUCTOR DEVICE AND METHOD OF MANUFACTURING ELECTRONIC DEVICE

(75) Inventor: Masakuni Shiozawa, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 300 days.

(21) Appl. No.: 10/833,945

(22) Filed: Apr. 28, 2004

(65) Prior Publication Data

US 2005/0266614 A1 Dec. 1, 2005

(30) Foreign Application Priority Data

May 2, 2003 (JP) .............................. 2003-127059

(51) Int. Cl.
*H01L 21/44* (2006.01)
(52) U.S. Cl. ...................... 438/107; 438/113; 438/430; 257/E21.499
(58) Field of Classification Search ............ 438/14–18, 438/68, 107–114, 121–127, 118, 460–462; 257/E21.449
See application file for complete search history.

(56) References Cited

U.S. PATENT DOCUMENTS

| | | | |
|---|---|---|---|
| 6,025,648 A | 2/2000 | Takahashi et al. | |
| 6,489,676 B2 | 12/2002 | Taniguchi et al. | |
| 6,528,871 B1 | 3/2003 | Tomita | |
| 6,650,008 B2* | 11/2003 | Tsai et al. | 257/686 |
| 2002/0148897 A1* | 10/2002 | Rumsey | 235/454 |
| 2004/0145044 A1* | 7/2004 | Sugaya et al. | 257/698 |
| 2004/0164385 A1* | 8/2004 | Kado et al. | 257/678 |

FOREIGN PATENT DOCUMENTS

| | | |
|---|---|---|
| JP | 10-294423 | 11/1998 |
| JP | 11-260999 | 9/1999 |
| JP | 2000-133748 | 5/2000 |
| JP | 2001-044362 | 2/2001 |
| JP | 2001-267492 | 9/2001 |
| JP | 2001-319990 | 11/2001 |
| JP | 2002-124628 | 4/2002 |
| JP | 2002-170906 | 6/2002 |

* cited by examiner

*Primary Examiner*—Thanhha S. Pham
(74) *Attorney, Agent, or Firm*—Hogan & Hartson LLP

(57) ABSTRACT

A method of manufacturing a semiconductor device includes mounting a first semiconductor chip on each partitioned region of a frame substrate partitioned for each first semiconductor package; mounting a second semiconductor package, where a second semiconductor chip is mounted, on each partitioned region of the frame substrate so as to be arranged above the first semiconductor chip; and cutting the frame substrate, where the second semiconductor package is mounted, for each partitioned region of the frame substrate.

13 Claims, 6 Drawing Sheets

METHOD OF MANUFACTURING SEMICONDUCTOR DEVICE AND METHOD OF MANUFACTURING ELECTRONIC DEVICE

BACKGROUND OF THE INVENTION

1. Field of the Invention

The present invention relates to a method of manufacturing a semiconductor device and a method of manufacturing an electronic device, and is, particularly, suitable for applying to a stacked structure of a semiconductor package.

2. Description of the Related Art

In the conventional semiconductor device, in order to save space when mounting semiconductor chips, there has been a method of stacking a semiconductor package where semiconductor chips are mounted.

However, in a conventional method of stacking semiconductor packages, because each semiconductor package is bonded as a single piece, the semiconductor package has to be handled as a single piece and there have been problems with complicated handling of the semiconductor packages such as in a reflow process and characteristic inspections.

Therefore, the present invention is to provide a method of manufacturing a semiconductor device, which can improve the manufacturing efficiency of the stacked structure of the semiconductor packages, and a method of manufacturing electronic devices.

SUMMARY OF THE INVENTION

In order to solve the above-described problem, a method of manufacturing a semiconductor device according to an embodiment of the present invention includes mounting a first semiconductor chip on each partitioned region of a frame substrate partitioned for each first semiconductor package; mounting a second semiconductor package, where a second semiconductor chip is mounted, on each partitioned regions so as to be arranged above the first semiconductor chip; and cutting the frame substrate, where the second semiconductor package is mounted, for each partitioned region.

Accordingly, while a plurality of the first semiconductor packages can be integrally handled, the second semiconductor package can be stacked on the first semiconductor package. By transferring and positioning one frame substrate, a reflow process and characteristic inspections for a stacked structure of a plurality of the semiconductor packages can be performed. Accordingly, this eliminates the necessity for handling each of the semiconductor packages as a single piece when stacking the semiconductor packages. Thereby, the manufacturing efficiency of the stacked structure of the semiconductor packages can be improved.

Furthermore, a method of manufacturing a semiconductor device according to an embodiment of the present invention includes mounting the first semiconductor on each partitioned region of the frame substrate partitioned for each first semiconductor package; mounting the second semiconductor package, where the second semiconductor chip is mounted, so that an end of the second semiconductor package is arranged above the first semiconductor chip on each partitioned region; and cutting the frame substrate, where the second semiconductor package is mounted, for each partitioned region.

Accordingly, while a plurality of the first semiconductor packages can be integrally handled, the second semiconductor package can be stacked on the first semiconductor package. Furthermore, a plurality of semiconductor packages can be stacked above the same first semiconductor chip. Accordingly, this eliminates the necessity for handling each of the semiconductor packages as a single piece when stacking the semiconductor packages. Thereby, the mounting area can be further reduced and the manufacturing efficiency of the stacked structure of the semiconductor package can be improved.

Furthermore, a method of manufacturing a semiconductor device according to an embodiment of the present invention includes inspecting the frame substrate, where the first semiconductor chip is mounted, for the each partitioned region and skipping to mount the second semiconductor package to the partitioned region, which is determined to be defective in the inspection. Accordingly, this can prevent the second semiconductor package from being mounted on the partitioned region, which is determined to be defective. Also, a plurality of the first semiconductor packages can be integrally handled and the second semiconductor packages can be prevented from being wasted.

Furthermore, a method of manufacturing a semiconductor device according to an embodiment of the present invention further includes forming a protruding electrode for each partitioned region of the frame substrate before cutting the frame substrate for each partitioned region. Accordingly, this eliminates the necessity for handling the semiconductor package as a single piece when forming the protruding electrode. Thereby, the manufacturing efficiency of the stacked structure of the semiconductor packages can be improved.

Furthermore, a method of manufacturing a semiconductor device according to an embodiment of the present invention further includes resin-sealing the first semiconductor package or the second semiconductor package before cutting the frame substrate for the each partitioned region. Accordingly, this eliminates the necessity for handling the semiconductor package as a single piece when resin-sealing the semiconductor package. Thereby, the manufacturing efficiency of stacked structure of the semiconductor packages can be improved, and the resin-sealing can be performed with better accuracy while preventing the sealing resin from squeezing out from an end of the semiconductor package.

Furthermore, according to a method of manufacturing a semiconductor device of an embodiment of the present invention, the first semiconductor package includes a first carrier substrate, where the first semiconductor chip is flip-chip mounted and a first protruding electrode, provided on the first carrier substrate. The second semiconductor package includes a second carrier substrate, where the second semiconductor chip is mounted; a second protruding electrode, bonded on the first carrier substrate and holding the second carrier substrate on the first semiconductor chip; and a sealing member for sealing the second semiconductor chip.

Accordingly, even when the type of the first semiconductor package is different from that of the second semiconductor package, a plurality of the first semiconductor packages can be integrally handled, and the second semiconductor package can be stacked on the first semiconductor package. Thereby the space-saving can be attained, and the manufacturing efficiency of the stacked structure of the semiconductor packages can be improved.

Furthermore, according to a method of manufacturing a semiconductor device of an embodiment of the present invention, the first semiconductor package is a ball grid array. The first semiconductor chip is mounted on the first carrier substrate and the second semiconductor package is a ball grid array or chip size package. The second semiconductor chip mounted on the second carrier substrate is mold-sealed.

Accordingly, even when multi-purpose package is used, a plurality of the first semiconductor packages can be integrally handled, the second semiconductor package can be stacked on the first semiconductor package, and the space-saving can be attained. Thereby, the manufacturing efficiency of the stacked structure for the different types of semiconductor packages can be improved. Furthermore, a method of manufacturing a semiconductor device of an embodiment of the present invention includes mounting the first semiconductor chip on each partitioned region of the first frame substrate partitioned for each first semiconductor package; mounting the second semiconductor chip on each partitioned region of the second frame substrate partitioned for each second semiconductor package; stacking the second frame substrate, where the second semiconductor chip is mounted, on the first frame substrate, where the first semiconductor chip is mounted, so as to arrange the partitioned region of the second frame substrate above the partitioned region of the first frame substrate; and cutting the first frame substrate, where the second frame substrate is stacked, for each partitioned region.

Accordingly, while a plurality of the first semiconductor packages and a plurality of the second semiconductor packages can be integrally handled, the second semiconductor package can be stacked on the first semiconductor package, and by transferring and positioning one frame substrate, a reflow process and characteristic inspection for the stacked structure of a plurality of the semiconductor packages can be performed, and sealing can be performed integrally. Accordingly, this eliminates the necessity for handling each of the semiconductor packages as a single piece. Thereby, the manufacturing efficiency of the stacked structure of the semiconductor package can be improved.

Furthermore, a method of manufacturing an electronic device of an embodiment of the present invention includes mounting a first electronic part on each partitioned region of the frame substrate partitioned for each first package; mounting a second package, where a second electronic part is mounted, on each partitioned region so as to be arranged above the first electronic part; and cutting the frame substrate, where the second package is mounted, for each partitioned region.

Accordingly, while a plurality of the first semiconductor packages can be integrally handled, the second package can be stacked on the first semiconductor packages, and by transferring and positioning one frame substrate, the reflow process and the characteristic inspection for the stacked structure of a plurality of the semiconductor packages can be performed. Accordingly, this eliminates the necessity for handling each of the semiconductor packages as a single piece when stacking the semiconductor packages. Thereby, the manufacturing efficiency of the stacked structure of the semiconductor package can be improved.

DESCRIPTION OF THE PREFERRED EMBODIMENTS

Hereinafter, semiconductor devices and methods of manufacturing the same according to embodiments of the present invention will be described with referring to the accompanying drawings.

FIGS. 1A-1D are plan views showing a method of manufacturing a semiconductor device according to a first embodiment of the present invention, and FIGS. 1B-1D and FIGS. 2A-2C are sectional views by cutting a part of the plan view of FIGS. 1A-1D.

Figure 1A:
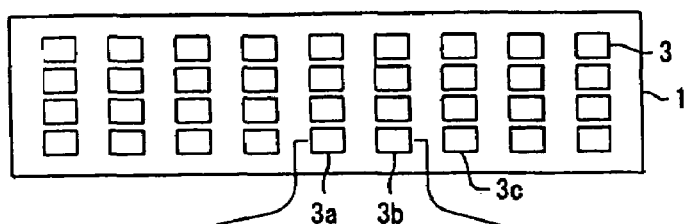
FIGS. 1A-1D are views showing a method of manufacturing a semiconductor device according to a first embodiment.
Figure 1B:
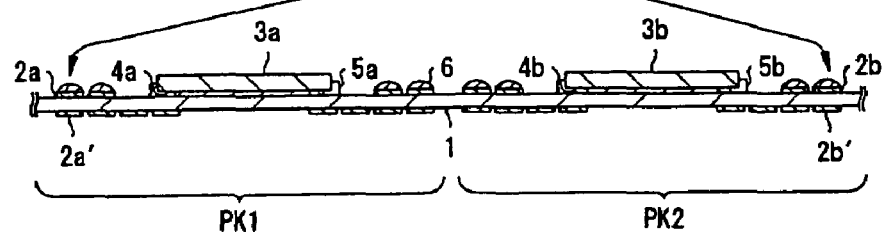

In FIG. 1A, a frame substrate 1 is partitioned for each semiconductor package. On the frame substrate 1, a plurality of semiconductor chips 3 are mounted on each partitioned region. For example, on the frame substrate 1, semiconductor packages PK1 and PK2 are formed integrally corresponding to semiconductor chips 3a and 3b. As shown in FIG. 1B, lands 2a and 2b are formed on the front surface of the frame substrate 1, where semiconductor packages PK1 and PK2 are formed, and lands 2a' and 2b' are formed on the back surface of the frame substrate 1. On the frame substrate 1, corresponding to the semiconductor packages PK1 and PK2, semiconductor chips 3a and 3b are respectively flip-chip mounted, and protruding electrodes 4a and 4b for flip-chip mounting are respectively provided on the semiconductor chips 3a and 3b. Then, the protruding electrodes 4a and 4b, respectively provided on the semiconductor chips 3a and 3b, are bonded to the frame substrate 1 by an Anisotropic Conductive Film (ACF) through respective anisotropic conductive sheets 5a and 5b. Flux 6 is provided onto lands 2a and 2b on the frame substrate 1. Solder paste may be provided instead of the flux 6.

Figure 1C:
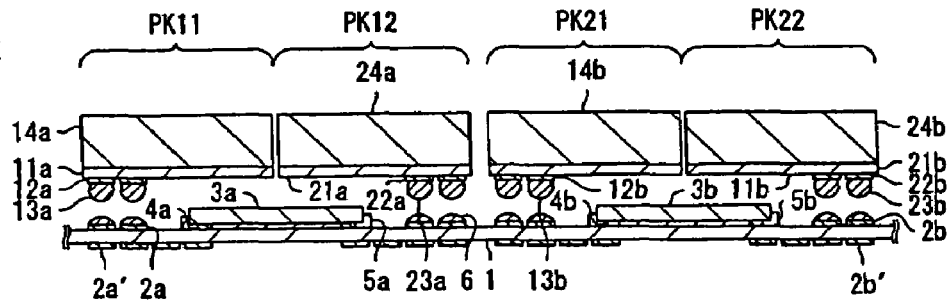

Next, as shown in FIG. 1C, protruding electrodes 13a and 23a, respectively provided on the semiconductor packages PK11 and PK12, are arranged above the land 2a of the semiconductor package PK1, and the semiconductor packages PK11, PK12, PK21 and PK22 are positioned so that protruding electrodes 13b and 23b, respectively provided on the semiconductor PK21 and PK22, are arranged above the land 2b of the semiconductor package PK2.

Here, carrier substrates 11a and 21a are respectively provided on the semiconductor packages PK11 and PK12, lands 12a and 22a are respectively formed on the back surface of the carrier substrates 11a and 21a, and the protruding electrodes 13a and 23a such as solder balls are respectively provided on the lands 12a and 22a. Semiconductor chips are mounted on the carrier substrates 11a and 21a, and the entire surfaces of the carrier substrates 11a and 21a, where the semiconductor chip is mounted, are respectively sealed with a sealing resin 14a and 24a.

Then, carrier substrates 11b and 21b are respectively provided on the semiconductor packages PK21 and PK22, lands 12b and 22b are formed respectively on the back surface of the carrier substrates 11b and 21b, and the protruding electrodes 13b and 23b such as solder balls are respectively provided on the lands 12b and 22b. Semiconductor chips are mounted on the carrier substrates 11b and 21b, and the entire surfaces of the carrier substrates 11b and 21b, where the semiconductor chip is mounted, are respectively sealed with a sealing resin 14b and 24b. In addition, on the carrier substrates 11a, 21a, 11b and 21b, wire bonded semiconductor chips may be mounted, semiconductor chips may be flip-chip mounted, and stacked structures of semiconductor chips may be mounted.

Figure 1D:
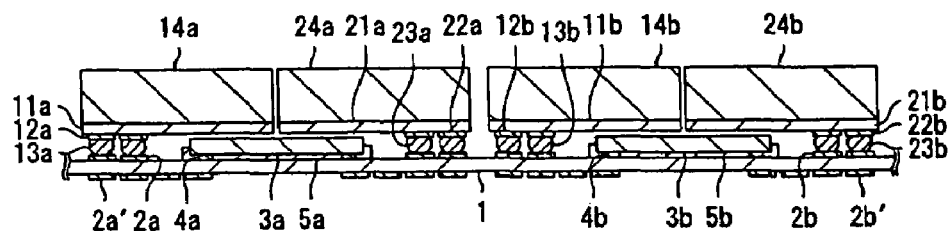

Next, as shown in FIG. 1D, semiconductor packages PK11 and PK12 are mounted on the semiconductor package PK1 formed on the frame substrate 1, and semiconductor packages PK21 and PK22 are mounted on the semiconductor package PK2 formed on the frame substrate 1. By executing a reflow process of the frame substrate 1, where the semiconductor packages PK11, PK12, PK21 and PK22 are mounted, the protruding electrodes 13a and 23a are bonded onto the land 2a, and the protruding electrodes 13b and 23b are bonded onto the land 2b.

Accordingly, by mounting the semiconductor packages PK11, PK12, PK21 and PK22 on the frame substrate 1, the semiconductor packages PK11 and PK12 can be bonded on the semiconductor package PK1, and the semiconductor packages PK21 and PK22 can be bonded on the semiconductor package PK2 without handling the semiconductor package PK1 and the semiconductor package PK2 as a single piece. Thereby, the manufacturing process can be made more efficient.

In addition, before mounting the semiconductor packages PK11, PK12, PK21 and PK22 on the frame substrate 1, the semiconductor chip 3 mounted on the frame substrate 1 may be inspected. Then, the semiconductor packages PK11, PK12, PK21 and PK22 may be mounted only above the semiconductor chips 3, which are determined to be acceptable, and the semiconductor packages PK11, PK12, PK21 and PK22 may be omitted to be mounted above the semiconductor chips 3, which are determined to be defective. For example, if semiconductor chips 3a and 3b are determined to be acceptable and the semiconductor chip 3c is determined to be defective, the semiconductor packages PK11, PK12, PK21 and PK22 are mounted above the semiconductor ships 3a and 3b, and the subsequent processing for the frame substrate 1 may be performed without mounting the semiconductor packages above the semiconductor chip 3c.

Figure 2A:
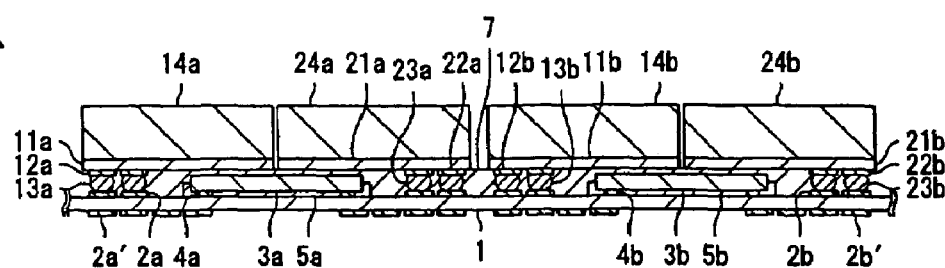
FIGS. 2A-2C are cross-sectional views showing a method of manufacturing a semiconductor device according to a first embodiment.

Accordingly, even when a plurality of semiconductor chips 3 are mounted on the frame 1, the semiconductor package can be mounted only above the inspected-and-accepted semiconductor chip 3 by selecting such a chip, thereby preventing the semiconductor package from being mounted above the frame substrate 1 in waste. Next, as shown in FIG. 2A, resin 7 is filled into the gap between the semiconductor packages PK11, PK12, PK21 and PK22 and the frame substrate 1, as required.

Accordingly, without handling the semiconductor packages PK1 and PK2 as a single piece, the resin 7 can be filled into the gap between the semiconductor packages PK11, PK12 and semiconductor package PK1, and the resin 7 can be filled into the gap between the semiconductor packages PK21, PK22 and semiconductor package PK2, thereby the resin-sealing step can be performed efficiently. In addition, by dividing the semiconductor package into individual pieces in a state that the resin 7 is filled, the resin 7 can be prevented from being squeezed out from the semiconductor packages PK1 and PK2, thereby the resin-sealing can be performed with better accuracy. In addition, the step in FIG. 2A may be omitted, and the description below will be made assuming that the step in FIG. 2A is omitted.

Figure 2B:
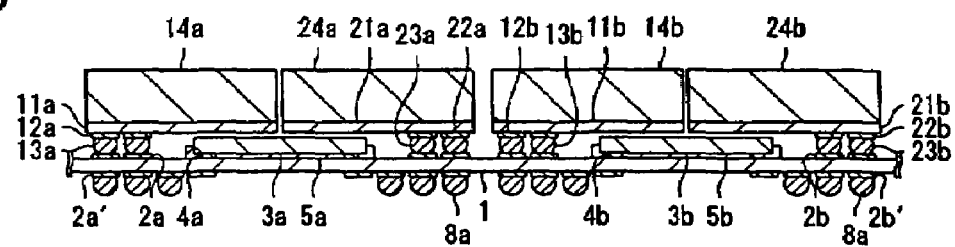

Next, as shown in FIG. 2B, protruding electrodes 8a and 8b for mounting the semiconductor packages PK1 and PK2 on a motherboard are formed on the lands 2a' and 2b', which are provided on the back surface of the frame substrate 1. Accordingly, the protruding electrodes 8a and 8b of the semiconductor packages PK1 and PK2 can be respectively formed without handling the semiconductor packages PK1 and PK2 as a single piece. Thereby, the protruding electrodes 8a and 8b can be efficiently formed.

In addition, after the protruding electrodes 8a and 8b are formed, the characteristic inspection for the frame substrate 1, where the semiconductor packages PK11, PK12, PK21 and PK22 are mounted, may be performed. Accordingly, without handling the semiconductor packages PK1 and PK2, where the semiconductor packages PK11, PK12, PK21 and PK22 are respectively mounted, as a single piece, the characteristic inspection for the semiconductor packages PK11, PK12, PK21 and PK22 mounted on the semiconductor packages PK1 and PK2 can be performed and the characteristic inspection for the semiconductor packages PK11, PK12, PK21 and PK22 can be performed efficiently.

Figure 2C:
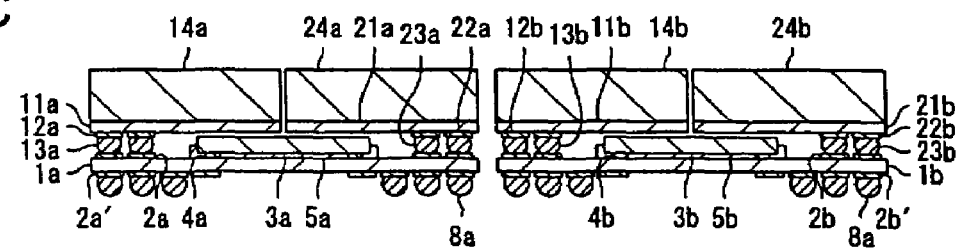

Next, as shown in FIG. 2C, by cutting the frame substrate 1, where the semiconductor packages PK11, PK12, PK21 and PK22 are mounted, for each semiconductor package PK1 and PK2, the semiconductor package PK1, where the semiconductor packages PK11 and PK12 are mounted on the carrier substrate 1a, is manufactured, and the semiconductor package PK2, where the semiconductor packages PK21 and PK22 are mounted on the carrier substrate 1b, is manufactured.

In addition, when the frame substrate 1 is cut for each partitioned region, dicing using a blade, laser machining, or punching machining may be used. Furthermore, as for the carrier substrates 1a, 11a, 21a, 1b, 11b and 21b, for example, a double-sided board, a multi-layer wiring board, a build-up board, a tape board or a film board can be used. As for the material of the carrier substrates 1a, 11a, 21a, 1b, 11b, 21b, for example, polyimide resin, glass epoxy resin, BT resin, a composite of aramid and an epoxy or ceramics can be used. As for the protruding electrodes 4a, 8a, 13a, 23a, 4b, 8b, 13b, 23b, for example, Au bump, Cu bump or Ni bump coated with solder material or the like, or solder ball can be used.

In addition, when the semiconductor packages PK11, PK12, PK21 and PK22 are bonded to the frame substrate 1 through the protruding electrodes 13a, 23a, 13b, 23b, a metal bonding such as a solder bonding and an alloy bonding may be used, and pressure welding such as an ACF bonding, a Nonconductive Film (NCF) bonding, an Anisotropic Conductive Paste (ACP) bonding, and a Nonconductive Paste (NCP) bonding may be used. In addition, the above-mentioned embodiments describes a method of using ACF bonding when the semiconductor chips 3a and 3b are flip-chip mounted on the frame substrate 1 through the respective protruding electrodes 4a and 4b, however, pressure welding such as NCF bonding, ACP bonding or NCP bonding may be used, and metal bonding such as solder bonding and alloy bonding may be used.

Figure 3:
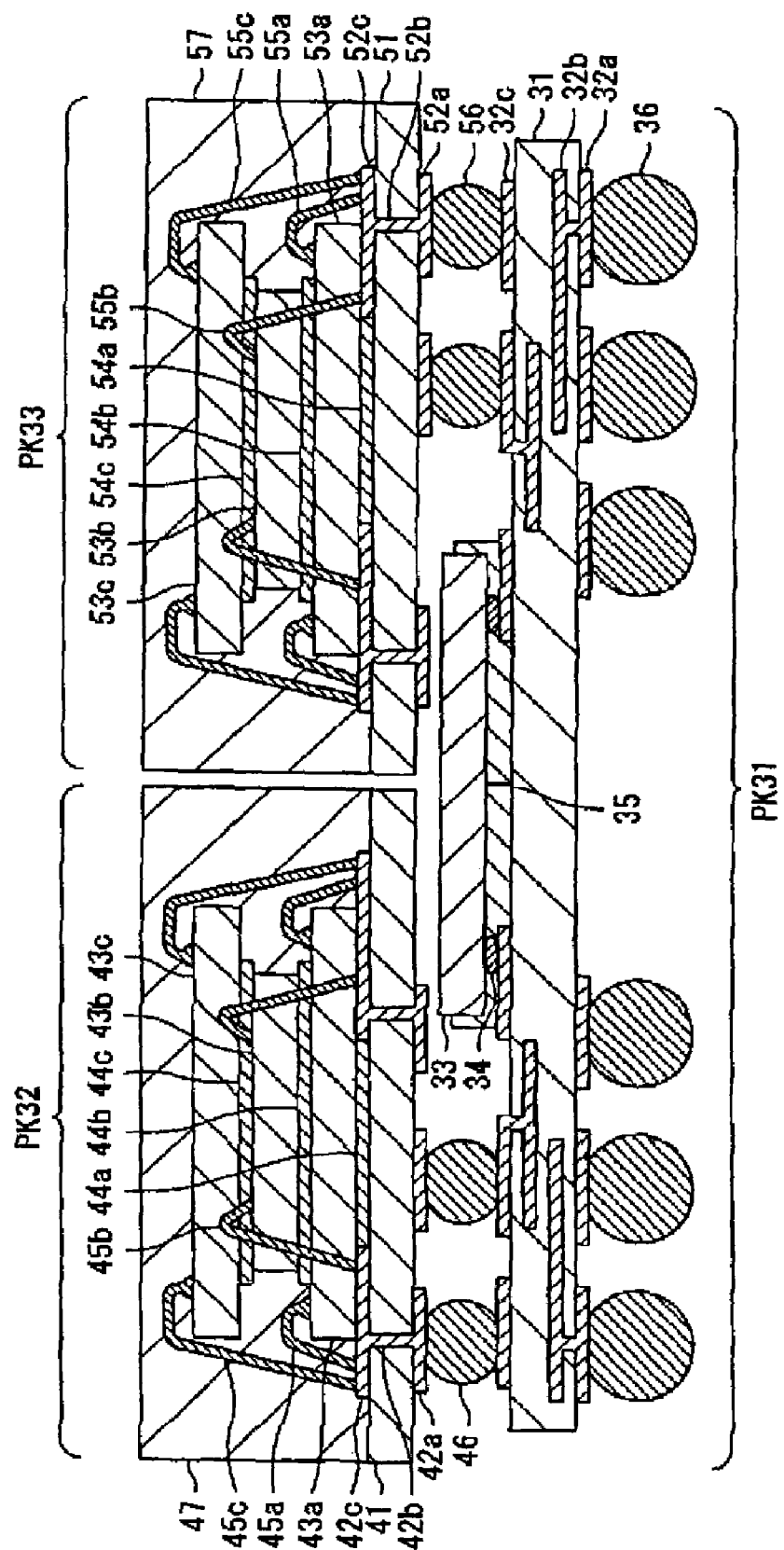
FIG. 3 is a cross-sectional view showing a structure of semiconductor device according to a second embodiment.

FIG. 3 is a cross-sectional view showing a structure of a semiconductor device according to a second embodiment of the present invention. In FIG. 3, a carrier substrate 31 is provided in a semiconductor package PK31, lands 32a and 32c are formed on both surfaces of the carrier substrate 31, and an internal wiring 32b is formed in the carrier substrate 31. A semiconductor chip 33 is flip-chip mounted on the carrier substrate 31, and protruding electrodes 34 for flip-chip mounting are provided on the semiconductor chip 33.

Then, the protruding electrodes 34, provided on the semiconductor chip 33, are bonded on the land 32c by ACF bonding through an anisotropic conductive sheet 35. On the land 32a, provided on the back surface of carrier substrate 31, there is provided a protruding electrode 36 for mounting the carrier 31 on a motherboard.

On the other hand, carrier substrates 41 and 51 are respectively provided in semiconductor packages PK32 and PK33. Lands 42a and 52a are respectively formed on the back surfaces of the carrier substrates 41 and 51, lands 42c and 52c are respectively formed on the front surfaces of the carrier substrates 41 and 51, and internal wirings 42b and 52b are respectively formed in the carrier substrates 41 and 51.

Then, on the carrier substrates 41 and 51, semiconductor chips 43a and 53a are respectively face-up mounted through respective adhesion layers 44a and 54a, and the semiconductor chips 43a and 53a are respectively wire-bonded to lands 42c and 52c through respective conductive wires 45a and 55a. Furthermore, on the semiconductor chips 43a and 53a, semiconductor chips 43b and 53b are respectively face-up mounted, avoiding the conductive wires 45a and 55a. The semiconductor chips 43b and 53b are respectively fixed on the semiconductor chips 43a and 53a through respective adhesion layers 44b and 54b, while being respectively wire-bonded to the lands 42c and 52c through respective conductive wires 45b and 55b. Furthermore, on the semiconductor chips 43b and 53b, semiconductor chips 43c and 53c are respectively face-up mounted, avoiding the conductive wires 45b and 55b, and the semiconductor chips 43c and 53c are respectively fixed on the semiconductor chips 43b and 53b through respective adhesion layers 44c and 54c, while being respectively wire-bonded to the lands 42c and 52c through respective conductive wires 45c and 55c.

Moreover, on the lands 42a and 52a, respectively provided on the back surface of the carrier substrates 41 and 51, the protruding electrodes 46 and 56 are provided so as to mount the carrier substrates 41 and 51, respectively, on the carrier substrate 31, in a way that the carrier substrates 41 and 51 are held above the semiconductor chip 33. It is preferable that the protruding electrodes 46 and 56 exist, at least, at the four corners of the carrier substrates 41 and 51, and the protruding electrodes 46 and 56 can be arranged in a C-shape, for example.

Then, by bonding the protruding electrodes 46 and 56 to the lands 32c, provided on the carrier substrate 31, the carrier substrates 41 and 51 can be mounted on the carrier substrate 31 so that ends of the carrier substrates 41 and 51 are arranged above the semiconductor chip 33. Moreover, sealing resin 47 and 57 are respectively provided on the carrier substrates 41 and 51, which are the mounting side of the semiconductor chips 43a through 43c and 53a through 53c. Thereby the semiconductor chips 43a through 43c and 53a through 53c are sealed by the sealing resin 47 and 57, respectively.

Accordingly, a plurality of semiconductor packages PK32 and PK33 can be arranged above the same semiconductor chip 33, thereby a three-dimensionally mounting of different types of the semiconductor chips 33, 43a through 43c and 53a through 53c can be attained while enabling reduction of the mounting area. Moreover, when the semiconductor package PK31, where semiconductor packages PK32 and PK33 are mounted, is manufactured, the semiconductor package PK31, where the semiconductor packages PK32 and PK33 are mounted, can be cut from one frame substrate by cutting one frame substrate, where a plurality of the semiconductor packages PK32 and PK33 are mounted.

Accordingly, while enabling to integrally handle a plurality of the semiconductor packages PK31, the semiconductor packages PK32 and PK33 can be stacked on the semiconductor package PK31. Accordingly, when the semiconductor packages PK32 and PK33 are stacked on the semiconductor package PK31, handling each of the semiconductor packages PK31 as a single piece becomes unnecessary, thereby the manufacturing efficiency of the stacked structure of semiconductor packages PK31, PK32 and PK33 can be improved.

Figure 4A:
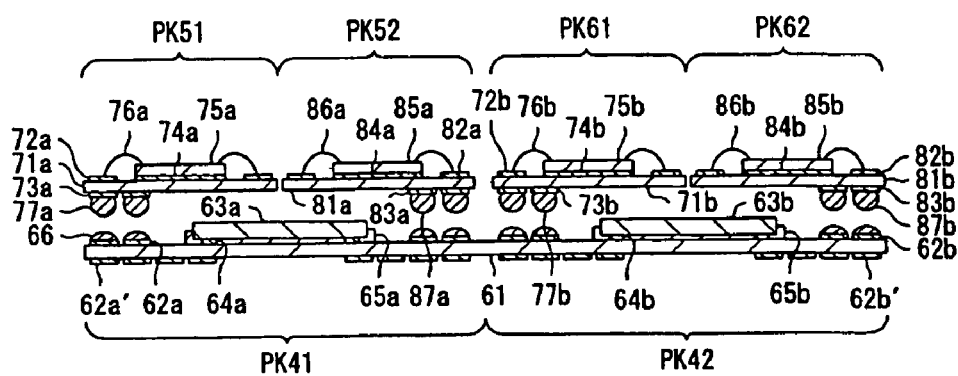
FIGS. 4A and 4B are cross-sectional views showing a method of manufacturing a semiconductor device according to a third embodiment.

FIGS. 4A and 4B and FIGS. 5A-5C are cross-section views showing a method of manufacturing a semiconductor device according to a third embodiment of the present invention. In FIG. 4A, a frame substrate 61 is partitioned for each semiconductor package PK41 and PK42. On the frame substrate 61, semiconductor chips 63a and 63b are mounted for each partitioned region. Here, lands 62a and 62b are respectively formed on the front surface of the frame substrate 61, where the semiconductor packages PK41 and PK42 are formed, and lands 62a' and 62b' are respectively formed on the back surface of the frame substrate 61. Then, on the frame substrate 61, the semiconductor chips 63a and 63b are respectively flip-chip mounted in correspondence with the semiconductor packages PK41 and PK42, and the semiconductor chips 63a and 63b are respectively provided with protruding electrodes 64a and 64b for flip-chip mounting. The protruding electrodes 64a and 64b, respectively provided on the semiconductor chips 63a and 63b, are bonded on the frame substrate 61 by ACF bonding through respective anisotropic conductive sheets 65a and 65b.

On the other hand, semiconductor packages PK51 and PK52 are respectively provided with carrier substrates 71a and 81a. Lands 72a and 82a are respectively formed on the front surface of the carrier substrates 71a and 81a, and lands 73a and 83a are respectively formed on the back surface of the carrier substrates 71a and 81a. Then, on the carrier substrates 71a and 81a, semiconductor chips 75a and 85a are respectively face-up mounted through respective adhesive layers 74a and 84a. Then, the semiconductor chips 75a and 85a are respectively bonded to the lands 72a and 82a through respective conductive wires 76a and 86a. Furthermore, protruding electrodes 77a and 87a such as solder balls, are respectively formed on the lands 73a and 83a, respectively formed on the back surface of the carrier substrates 71a and 81a.

Moreover, semiconductor packages PK61 and PK62 are respectively provided with carrier substrates 71b and 81b. Lands 72b and 82b are respectively formed on the front surface of the carrier substrates 71b and 81b, and lands 73b and 83b are respectively formed on the back surface of the carrier substrates 71b and 81b. Then, on the carrier substrates 71b and 81b, semiconductor chips 75b and 85b are respectively face-up mounted through respective adhesive layers 74b and 84b. Then, the semiconductor chips 75b and 85b are respectively connected to the lands 72b and 82b through respective conductive wires 76b and 86b. Furthermore, protruding electrodes 77b and 87b such as solder balls are respectively formed on the lands 73b and 83b, respectively formed on the back surface of the carrier substrates 71b and 81b.

Then, when the semiconductor packages PK51, PK52, PK61 and PK62 are mounted on the frame substrate 61, flux 66 is supplied to the lands 62a and 62b of the frame substrate 61. Solder paste may be supplied instead of the flux 66. Then, protruding electrodes 77a and 87a, respectively provided on the semiconductor packages PK51 and PK52, are arranged above the land 62a of the semiconductor package PK41, and the semiconductor packages PK51, PK52, PK61 and PK62 are positioned so that protruding electrodes 77b and 87b, respectively provided on the semiconductor packages PK61 and PK62, are arranged above the land 62b of the semiconductor package PK42.

Figure 4B:
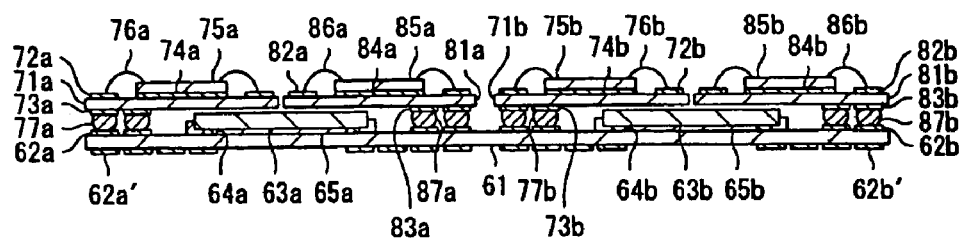

Next, as shown in FIG. 4B, the semiconductor packages PK51 and PK52 are mounted on the semiconductor package PK41 formed in the frame substrate 61, and the semiconductor packages PK61 and PK62 are mounted on the semiconductor package PK42 formed in the frame substrate 61. Then, by executing a reflow process of the frame substrate 61, where the semiconductor packages PK51, PK52, PK61 and PK62 are mounted, protruding electrodes 77a and 87a are bonded on the land 62a, and protruding electrodes 77b and 87b are bonded on the land 62b.

Accordingly, by mounting the semiconductor packages PK51, PK52, PK61 and PK62 on the frame substrate 61, the semiconductor packages PK51 and PK52 can be bonded on the semiconductor package PK41, and the semiconductor packages PK61 and P62 can be bonded on the semiconductor package PK42 without handling the semiconductor packages PK41 and PK42 as a single piece, thereby the manufacturing process can be made efficient.

Figure 5A:
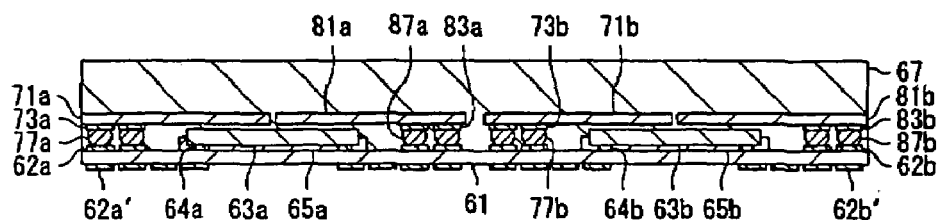
FIGS. 5A-5C are cross-sectional views showing a method of manufacturing a semiconductor device according to the third embodiment.

Next, as shown in FIG. 5A, the semiconductor packages PK51, PK52, PK61 and PK62, mounted in the frame substrate 61, are sealed with sealing resin 67. When the semiconductor packages PK51, PK52, PK61 and PK62 are sealed with the sealing resin 67, all of the upper surface of the frame substrate 61 can be mold-formed, for example.

Accordingly, even when the semiconductor packages PK51, PK52, PK61 and PK62 are different in size and type, a plurality of semiconductor packages PK51, PK52, PK61 and PK62 can be sealed with resin integrally, thereby enabling to make the resin sealing process efficient. Moreover, by dividing the semiconductor packages into single pieces with the resin 67 filled, the sealing resin 67 can be prevented from squeezing out from the semiconductor package, thereby resin sealing can be carried out precisely.

Figure 5B:
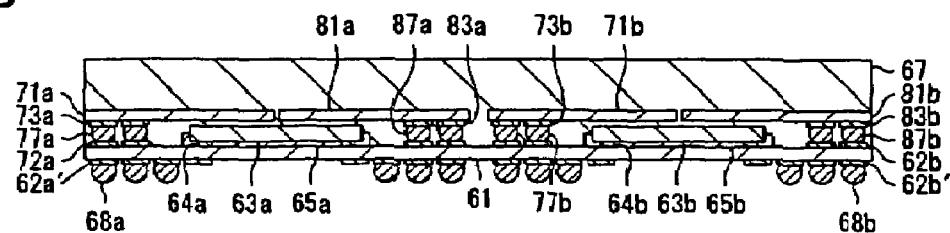

Next, as shown in FIG. 5B, on lands 62a', 62b', provided on the back surface of the frame substrate 61, protruding electrodes 68a and 68b are respectively formed for mounting the semiconductor packages PK41 and PK42 on the motherboard. Accordingly, the protruding electrodes 68a and 68b in the semiconductor packages PK41 and PK42 can be respectively formed without handling the semiconductor packages PK41 and PK42 as a single piece, thereby the protruding electrodes 68a and 68b can be formed more efficiently.

Figure 5C:
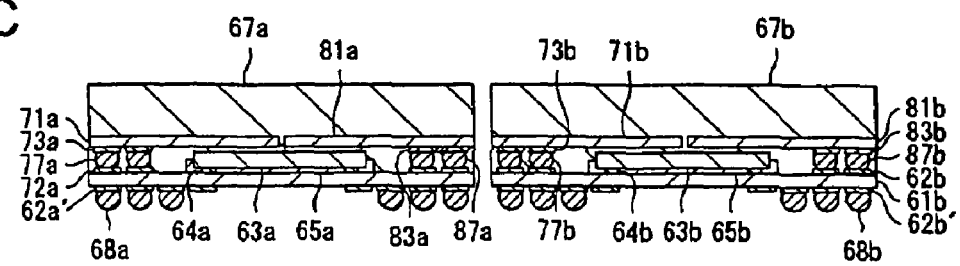

Next, as shown in FIG. 5C, the frame substrate 61, where the semiconductor packages PK51, PK52, PK61 and PK62 are mounted, are cut together with the sealing resin 67 for each semiconductor package PK41 and PK42. Accordingly, the semiconductor package PK41, where the semiconductor packages PK51 and PK52 are mounted on the carrier substrate 61a and sealed with the sealing resin 67a, can be manufactured, and the semiconductor package PK42, where the semiconductor packages PK61 and PK62 are mounted on the carrier substrate 61b and sealed with the sealing resin 67b, can be manufactured.

Figure 6A:
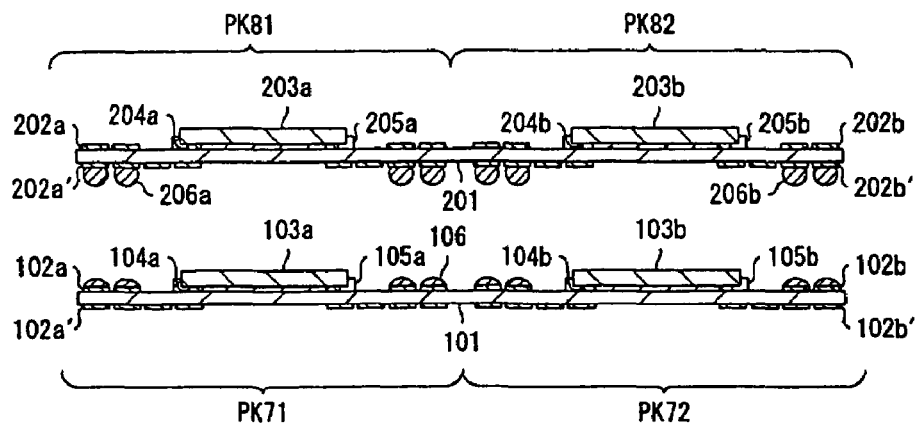
FIGS. 6A-6D are cross-sectional views showing a method of manufacturing a semiconductor device according to a fourth embodiment.
Figure 6B:
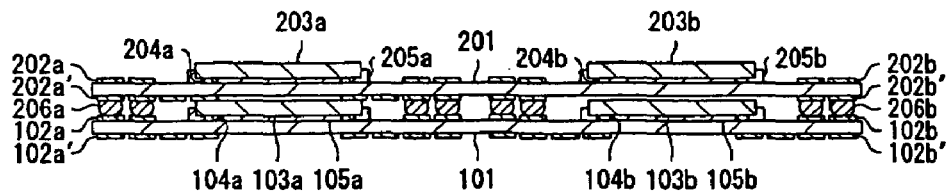
Figure 6C:
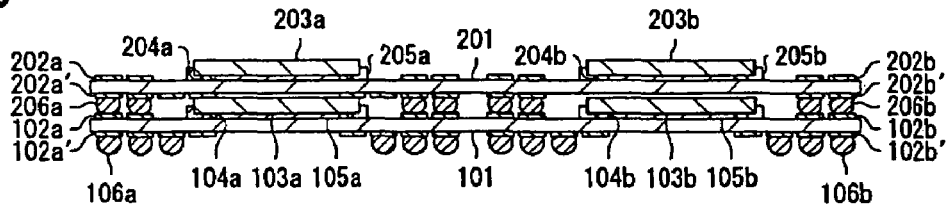

FIGS. 6A-6C are cross-sectional views showing a method of manufacturing a semiconductor device according to a fourth embodiment of the present invention. In FIG. 6A, a frame substrate 101 is partitioned for each semiconductor package PK71 and PK72. Then, on the frame substrate 101, semiconductor chips 103a and 103b are mounted for each partitioned region. Here, lands 102a and 102b are respectively formed on the front surface of the frame substrate 101, where the semiconductor packages PK71 and PK72 are formed, and lands 102a' and 102b' are respectively formed on the back surface of the frame substrate 101. Then, on the frame substrate 101, the semiconductor chips 103a and 103b are respectively flip-chip mounted in correspondence with the semiconductor packages PK71 and PK72, and the semiconductor chips 103a and 103b are respectively provided with protruding electrodes 104a and 104b for flip-chip mounting. The protruding electrodes 104a and 104b, respectively provided on the semiconductor chips 103a and 103b, are bonded on the frame substrate 101 by ACF bonding through respective anisotropic conductive sheets 105a and 105b.

Moreover, a frame substrate 201 is partitioned for each semiconductor package PK81 and PK82. Then, on the frame substrate 201, semiconductor chips 203a and 203b are mounted for each partitioned region. Here, lands 202a and 202b are respectively formed on the front surface of the frame substrate 201, where the semiconductor packages PK81 and PK82 are formed, and lands 202a' and 202b' are respectively formed on the back surface of the frame substrate 201. Then, on the frame substrate 201, the semiconductor chips 203a and 203b are respectively flip-chip mounted in correspondence with the semiconductor packages PK81 and PK82, and the semiconductor chips 203a and 203b are respectively provided with protruding electrodes 204a and 204b for flip-chip mounting. The protruding electrodes 204a and 204b, respectively provided on the semiconductor chips 203a and 203b, are bonded on the frame substrate 201 by ACF bonding through respective anisotropic conductive sheets 205a and 205b. Furthermore, protruding electrodes 206a and 206b such as solder balls are respectively formed on the lands 202a' and 202b', formed on the back surface of the frame substrates 201.

Then, when the semiconductor packages PK81 and PK82 are respectively mounted on the semiconductor package PK71 and PK72, flux 106 is supplied to the lands 102a and 102b of the frame substrate 101. Solder paste may be supplied instead of the flux 106. Then, protruding electrode 206a of the semiconductor package PK81 formed on the frame substrate 201 is arranged above the land 102a of the semiconductor package PK71, and the frame substrates 101 and 201 are positioned so that protruding electrode 206b of the semiconductor package PK82, formed in the frame substrate 201, is arranged above the land 102b of the semiconductor package PK72.

Next, as shown in FIG. 6B, the frame substrate 201, where the semiconductor packages PK81 and PK82 are formed, is mounted on the frame substrate 101, where semiconductor package PK71 and PK72 are formed. Then, by executing a reflow process of the frame substrate 101, where the frame substrate 201 is mounted, protruding electrodes 206a and 206b are respectively bonded on the lands 102a and 102b.

Accordingly, by mounting the frame substrate 201 on the frame substrate 101, the semiconductor packages PK81 and PK82 can be respectively bonded on the semiconductor packages PK71 and PK72 without handling not only the semiconductor packages PK71 and PK72 in the lower layer but also the semiconductor packages PK81 and PK82 in the upper layer as single piece, thereby the manufacturing process can be made efficient.

Next, as shown in FIG. 6C, on lands 102a', 102b', provided on the back surface of the frame substrate 101, protruding electrodes 106a and 106b are respectively formed for mounting the semiconductor packages PK71 and PK72 on the motherboard. Accordingly, the protruding electrodes 106a and 106b in the semiconductor packages PK71 and PK72 can be respectively formed without handling the semiconductor packages PK71 and PK72 as a single piece, thereby the protruding electrodes 106a and 106b can be formed more efficiently.

Figure 6D:
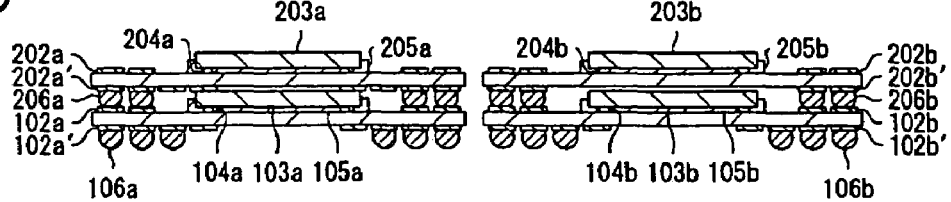

Next, as shown in FIG. 6D, the frame substrate 101, where the frame substrate 201 is stacked, is cut for each semiconductor package PK71 and PK72. Accordingly, the semiconductor package PK71, where the semiconductor package PK81 is stacked, can be manufactured, and the semiconductor package PK72, where the semiconductor package PK82 is stacked, can be manufactured.

In the above-described embodiments, a method of stacking semiconductor packages has been explained as an example, however, the present invention is not necessarily limited to a method of mounting a semiconductor package. For example, the present invention may be applied to methods of stacking ceramic elements such as a Surface Acoustic Wave (SAW) element, optical elements such as an optical modulator and an optical switch and various kinds of sensors such as a magnetic sensor and a biosensor.

What is claimed is:

1. A method of manufacturing a semiconductor device, comprising:
    mounting a first semiconductor chip on each partitioned region of a frame substrate partitioned for each first semiconductor package;
    mounting a second semiconductor package, where a second semiconductor chip is mounted on a carrier substrate of the second semiconductor package, on said each partitioned region of the frame substrate so as to be arranged above the first semiconductor chip,
    the carrier substrate of the second semiconductor package being bonded to the frame substrate by protruding electrodes for said each partitioned region of the frame substrate; and
    cutting the frame substrate, where the second semiconductor package is mounted, for said each partitioned region of the frame substrate.

2. The method of manufacturing a semiconductor device according to the claim 1, further comprising:
    inspecting the frame substrate, where the first semiconductor chip is mounted, for said each partitioned region of the frame substrate; and
    skipping to mount the second semiconductor package on a partitioned region of the frame substrate, which is determined to be defective in the inspection.

3. The method of manufacturing a semiconductor device according to claim 1, further comprising sealing the first semiconductor package or the second semiconductor package by resin before cutting said each partitioned region of the frame substrate.

4. The method of manufacturing a semiconductor device according to claim 2, further comprising forming said protruding electrodes for said each partitioned region of the frame substrate before cutting said each partitioned region of the frame substrate.

5. The method of manufacturing a semiconductor device according to claim 2, further comprising sealing the first semiconductor package or the second semiconductor package by resin before cutting said each partitioned region of the frame substrate.

6. The method of manufacturing a semiconductor device according to claim 1, further comprising sealing the first semiconductor package or the second semiconductor package by resin before cutting said each partitioned region of the frame substrate.

7. The method of manufacturing a semiconductor device according to claim 1, further comprising providing lands on a front surface of the frame substrate where the first semiconductor chip is mounted.

8. A method of manufacturing a semiconductor device, comprising:
    mounting a first semiconductor chip on each partitioned region of a frame substrate partitioned for each first semiconductor package;
    mounting a second semiconductor package, where a second semiconductor chip is mounted on a carrier substrate of the second semiconductor package, on said each partitioned region of the frame substrate so that an end of the second semiconductor package is arranged above the first semiconductor chip,
    the carrier substrate of the second semiconductor package being bonded to the frame substrate by protruding electrodes for said each partitioned region of the frame substrate; and
    cutting the frame substrate, where the second semiconductor package is mounted, for said each partitioned region of the frame substrate.

9. The method of manufacturing a semiconductor device according to the claim 8, further comprising:
    inspecting the frame substrate, where the first semiconductor chip is mounted, for said each partitioned region of the frame substrate; and
    skipping to mount the second semiconductor package on a partitioned region of the frame substrate, which is determined to be defective in the inspection.

10. The method of manufacturing a semiconductor device according to claim 8, further comprising forming said protruding electrodes for said each partitioned region of the frame substrate before cutting said each partitioned region of the frame substrate.

11. The method of manufacturing a semiconductor device according to claim 8, further comprising sealing the first semiconductor package or the second semiconductor package by resin before cutting said each partitioned region of the frame substrate.

12. A method of manufacturing an electronic device, comprising:
    mounting a first electronic part on each partitioned region of a frame substrate partitioned for each first package;
    mounting a second package, where a second electronic part is mounted on a carrier substrate of the second package, on said each partitioned region of a frame substrate so as to be arranged above the first electronic part,
    the carrier substrate of the second package being bonded to the frame substrate by protruding electrodes for said each partitioned region of the frame substrate; and
    cutting the frame substrate, where the second package is mounted, for said each partitioned region of the frame substrate.

13. A method of manufacturing a semiconductor device, comprising:
    mounting a plurality of first objects on a frame substrate having a plurality of partitioned regions such that one first object of the first objects is disposed on each partitioned region of the partitioned regions, each of the first objects includes a first semiconductor chip;

mounting a plurality of second objects on the frame substrate such that at least two second objects of the second objects overlap the one first object, each of the second objects includes a second semiconductor chip mounted on a carrier substrate, each of the second objects being bonded to the frame substrate by a protruding electrode, the carrier substrate being directly bonded to the frame substrate through the protruding electrode; and cutting the frame substrate into a plurality of pieces such that the one first object is disposed on each of the pieces.

* * * * *